(12) United States Patent
Park et al.

(10) Patent No.: US 9,666,821 B2
(45) Date of Patent: May 30, 2017

(54) METHOD OF MANUFACTURING MULTICOLOR QUANTUM DOT PATTERN, MULTICOLOR QUANTUM DOT PATTERN FORMED BY THE METHOD, AND QUANTUM DOT LIGHT-EMITTING DEVICE FOR THE METHOD

(71) Applicant: KOREA INSTITUTE OF SCIENCE AND TECHNOLOGY, Seoul (KR)

(72) Inventors: Joon-Suh Park, Seoul (KR); Il Ki Han, Seoul (KR); Ji Hoon Kyhm, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 14/754,941

(22) Filed: Jun. 30, 2015

(65) Prior Publication Data

US 2016/0351842 A1    Dec. 1, 2016

(30) Foreign Application Priority Data

May 27, 2015    (KR) .................. 10-2015-0074016

(51) Int. Cl.
*H01L 51/50* (2006.01)
*H01L 51/00* (2006.01)

(52) U.S. Cl.
CPC ........ *H01L 51/502* (2013.01); *H01L 51/0014* (2013.01)

(58) Field of Classification Search
CPC ..... H01L 31/035209; H01L 31/035218; H01L 51/502; H01L 51/0003; H01L 51/0096
See application file for complete search history.

(56) References Cited

U.S. PATENT DOCUMENTS

2007/0218398 A1    9/2007  Ito et al.
2011/0059264 A1*   3/2011  Park .................. C08J 7/18
                                                  427/510

(Continued)

FOREIGN PATENT DOCUMENTS

JP    2007-246417 A    9/2007
KR    10-0577061 B1    7/2005
KR    10-1140309 B1    7/2010

(Continued)

OTHER PUBLICATIONS

Seth Coe-Sullivan et al. Large-Area Ordered Quantum-Dot Monolayers via Phase Separation During Spin-Casting, Advanced Functional Materials, 2005, pp. 1117-1124. vol. No. 15 . USA.

(Continued)

*Primary Examiner* — Seahvosh Nikmanesh
(74) *Attorney, Agent, or Firm* — Goldilocks Zone IP Law

(57) ABSTRACT

Disclosed is a method of manufacturing a multicolor quantum dot pattern, which includes: forming a first photoresist pattern on a substrate; activating a surface of the substrate having the first photoresist pattern formed thereon; forming a first quantum dot layer on the activated substrate; generating a first quantum dot pattern by removing the first photoresist pattern; and generating a second quantum dot pattern on the same layer as the first quantum dot pattern generated on the substrate. Accordingly, various kinds of quantum dots may be easily implemented at a single substrate.

22 Claims, 8 Drawing Sheets

(56) References Cited

U.S. PATENT DOCUMENTS

2011/0309236 A1* 12/2011 Tian .................. H01L 27/14603
250/208.1
2014/0054541 A1 2/2014 Chung et al.

FOREIGN PATENT DOCUMENTS

KR 10-1098249 B1 6/2011
KR 10-2014-0025161 A 3/2014

OTHER PUBLICATIONS

Kim et al. Contact Printing of Quantum Dot Light-Emitting Devices, Nano letters, Nov. 18, 2008, pp. 4513-4517, vol. 8 No. 12.
Kim et al. Full-colour quantum dot displays fabricated by transfer printing, Nature photonics ,Mar. 2011, pp. 176-182, vol. 5.

* cited by examiner

METHOD OF MANUFACTURING MULTICOLOR QUANTUM DOT PATTERN, MULTICOLOR QUANTUM DOT PATTERN FORMED BY THE METHOD, AND QUANTUM DOT LIGHT-EMITTING DEVICE FOR THE METHOD

CROSS-REFERENCE TO RELATED APPLICATION

This application claims priority to Korean Patent Application No. 10-2015-0074016, filed on May 27, 2015, and all the benefits accruing therefrom under 35 U.S.C. §119, the contents of which in its entirety are herein incorporated by reference.

BACKGROUND

1. Field

The present disclosure relates to a method of manufacturing a multicolor quantum dot pattern, a multicolor quantum dot pattern formed by the method, and a quantum dot light-emitting device for the method, and more particularly, to a method of manufacturing a multicolor quantum dot pattern by patterning a plurality of quantum dots with different light-emitting characteristic on a single substrate, a multicolor quantum dot pattern formed by the method, and a quantum dot light-emitting device for the method.

Description about National Research and Development Support

This study was supported by the High-Tech Convergence Technology Development Program of Ministry of Science, ICT and Future Planning, Republic of Korea (Project No. 1711010032) under the superintendence of Korea Institute of Science and Technology.

2. Description of the Related Art

A display used for interaction between an electronic device and a user has been developed from Braun tubes in 1960 via flat displays such as LCD to next-generation displays such as OLED, flexible displays, transparent displays or the like. As the display market expands, the demand on displays with high brightness, low power consumption, high integration, and high color reproduction has been increased in the market.

A quantum dot display is expected as a display capable of satisfying the above market demand. In order to implement the quantum dot display, there is needed a technique for patterning quantum dots on a substrate for each color. In addition, quantum dots may also be probably utilized for sensors, solar cells, laser or the like, in addition to the display market. For this reason, there is needed a technique for patterning quantum dots on a substrate into a desired shape, and so various methodologies are being studied.

In the quantum dot display, it is an essential problem that quantum dots of various colors should be deposited to a single panel together. In case of an OLED, a metal mask is used to solve this problem, but this method has a problem in that a minimal size of pixel available for deposition is limited due to a metal mask and diffraction between the metal mask and a deposit. In addition, deposition of quantum dots using heat or vacuum evaporation is not available, and thus it has been discussed that other methodologies are needed.

For this reason, even though quantum dots have been spotlighted in the point that a phase separation method by spin-coating allows formation of a uniform quantum dot film in an organic/inorganic solution state, this method has been limited to a unicolor quantum dot light-emitting body (Non-patent Literature 1).

In order to overcome such limitations, contact-printing has been proposed. In the contact-printing, quantum dots of various colors applied to various substrates are transferred to a target substrate like stamping (Non-patent Literature 2). This method is advantageous in reducing the consumption of quantum dots and allowing 1000 pixels per inch, but in the industrial aspect, there is a serious burden in that a new processing line should be fabricated and a polymer stamp used for transferring should be continuously prepared.

SUMMARY

The present disclosure is directed to providing a method of manufacturing a multicolor quantum dot pattern with different light-emitting characteristics.

The present disclosure is also directed to providing a multicolor quantum dot pattern, which is formed according to the method of manufacturing a multicolor quantum dot pattern.

The present disclosure is also directed to providing a quantum dot light-emitting device, which applies the multicolor quantum dot pattern formed according to the method of manufacturing a multicolor quantum dot pattern to a light-emitting layer.

In one aspect, there is provided a method of manufacturing a multicolor quantum dot pattern, which includes: forming a first photoresist pattern on a substrate; activating a surface of the substrate having the first photoresist pattern formed thereon; forming a first quantum dot layer on the activated substrate; generating a first quantum dot pattern by removing the first photoresist pattern; and generating a second quantum dot pattern on the same layer as the first quantum dot pattern generated on the substrate.

In an embodiment of the present disclosure, the generating of a second quantum dot pattern may include: forming a second photoresist pattern on the substrate to cover the first quantum dot pattern; activating the surface of the substrate on which the second photoresist pattern is formed; forming a second quantum dot layer on the activated substrate; and generating a second quantum dot pattern by removing the second photoresist pattern.

In an embodiment of the present disclosure, the forming of a first quantum dot layer on the activated substrate forms a first quantum dot layer by means of a layer-by-layer assembly method using charges.

In an embodiment of the present disclosure, the forming of a first quantum dot layer on the activated substrate may include: coating a polymer charged with a polarity opposite to a surface charge of the activated substrate onto the substrate; washing the substrate with water having pH 6 to pH 8; drying the substrate with nitrogen; coating quantum dots having a functional group charged with a polarity opposite to the polymer charge of the substrate onto the substrate; washing the substrate with water having pH 6 to pH 8; and drying the substrate with nitrogen.

In an embodiment of the present disclosure, the forming of a first quantum dot layer on the activated substrate may form the first quantum dot layer into a multi-layer by repeatedly executing the steps defined above.

In an embodiment of the present disclosure, the charged polymer may be present in a solution state containing 0.5 to 50 wt % of positively-charged or negatively-charged polymer electrolyte.

In an embodiment of the present disclosure, the charged polymer may be any one of poly diallyldimethylamonium chloride (PDDA) and poly allylamine hydrochloride (PAH) in case the charged polymer is a positive charge polymer, and the charged polymer may be any one of poly sodium styrene sulfonate (PSS) and polyacrylic acid (PAA) in case the charged polymer is a negative charge polymer.

In an embodiment of the present disclosure, the quantum dot may be a semiconductor nano crystal in a state of 0.01 to 10 mg/ml solution, whose surface is modified to have a predetermined charge.

In an embodiment of the present disclosure, the semiconductor nano crystal may have a light-emitting core portion with a size of several nanometers to several ten nanometers.

In an embodiment of the present disclosure, the quantum dot may be surface-modified with a compound to have a charge, and the compound may be composed with the quantum dot or intermediate material.

In an embodiment of the present disclosure, the compound may have at least one functional group selected from the group consisting of R—COOH (acid), R1-N—R2-R3 (amine: primary or secondary or tertially) and R—OH (alcohol) (where R represents an alkyl group having 1 to 8 carbons, and R1, R2 and R3 represent hydrogen (H) or materials having 1 to 8 carbons.

In an embodiment of the present disclosure, the intermediate material may be at least one selected from the group consisting of PEG, amphiphilic compound, oleic compound, amine compound, phosphorus compound, organosulfur compound, silane compound, dendrimer, protein, and peptide.

In an embodiment of the present disclosure, the activating of a surface of the substrate may adopt a surface-activating method using any one selected from the group consisting of oxygen plasma, ultraviolet-ozone, acid, base and microwave.

In an embodiment of the present disclosure, the surface-activating method using an acid may use any one selected from the group of sulfuric acid, nitric acid and hydrochloric acid with pH 6 or below.

In an embodiment of the present disclosure, the surface-activating method using a base may use any one selected from the group of NaOH, $K_2CO_3$, or KOH with pH 8 or above.

In an embodiment of the present disclosure, the substrate may be formed with any one selected from the group consisting of metal, base metal, ceramic, oxide film, semiconductor, organic matter and polymer.

In an embodiment of the present disclosure, the oxide film may include at least one of $SiO_2$, $TiO_2$, indium tin oxide (ITO), $Y_2O_3$, $Al_2O_3$, ZnO, $WO_3$, $MoO_3$, NiO, ZTO and $SnO_2$, and the polymer may include at least one of polymethylene (PE), polymethyl methacrylate (PMMA), polypropylene (PP), polyurethane (PUR), polystyrene (PS), polycarbonate (PC), perfluoro polyether (PFPE), polytetrafluoroethylene (PTFE) and acrylonitrile butadiene styrene (ABS).

In an embodiment of the present disclosure, the second quantum dot may have a light-emitting characteristic different from the first quantum dot.

In an embodiment of the present disclosure, the second quantum dot may have the same light-emitting characteristic as the first quantum dot.

In an embodiment of the present disclosure, the first photoresist pattern may be formed with a photoresist which is removed by an organic solvent having a polarity index of 0 to 7.5.

In an embodiment of the present disclosure, the organic solvent may include at least one of alcohol (ROH: the number of carbon in R is 1 to 3), acetone, DMSO, NMP, NaOH, KOH and $K_2CO_3$.

In an embodiment of the present disclosure, the forming of a first quantum dot layer on the activated substrate may include: forming a first photoresist layer on the substrate; and etching the first photoresist layer to form a first photoresist pattern.

In an embodiment of the present disclosure, the etching of the first photoresist layer to form a first photoresist pattern may use any one of light, ion beam and electronic beam.

In another aspect of the present disclosure, there is provided a multicolor quantum dot pattern, which includes: a first quantum dot pattern formed on a substrate; and a second quantum dot pattern formed on the same layer as the first quantum dot pattern generated at the substrate and having a light-emitting characteristic different from the first quantum dot pattern, wherein each of quantum dots of the first quantum dot pattern and the second quantum dot pattern has a functional group at a surface thereof to have a predetermined charge.

In an embodiment of the present disclosure, the functional group may have a carboxyl group (—COOH) as a negative charge and have an amine group (—$NH_3$) as a positive charge.

In an embodiment of the present disclosure, at least one of the first quantum dot pattern and the second quantum dot pattern may have a multi-layer.

In another aspect of the present disclosure, there is provided a quantum dot light-emitting device, which includes at least one of a hole transport layer, a hole injection layer and an electron transport layer between a first electrode and a second electrode on a substrate and also includes a multicolor quantum dot pattern as a light-emitting layer, the light-emitting layer including: a first quantum dot pattern formed on a substrate; and a second quantum dot pattern formed on the same layer as the first quantum dot pattern generated at the substrate and having a light-emitting characteristic different from the first quantum dot pattern, wherein each of quantum dots of the first quantum dot pattern and the second quantum dot pattern has a functional group at a surface thereof to have a predetermined charge.

In an embodiment of the present disclosure, the functional group may have a carboxyl group (—COOH) as a negative charge and have an amine group (—$NH_3$) as a positive charge.

In an embodiment of the present disclosure, at least one of the first quantum dot pattern and the second quantum dot pattern may have a multi-layer.

In an embodiment of the present disclosure, sizes of the first quantum dot pattern and the second quantum dot pattern may correspond to a pixel size.

The quantum dot pattern formed by the method of manufacturing a multicolor quantum dot pattern according to the present disclosure allows various quantum dots to be patterned to a single substrate with various shapes. In detail, as a technique for patterning quantum dots with various light-emitting frequencies to a single substrate together, quantum dots are coated to a surface of a substrate, which is patterned using a sensitizer, by means of charges (layer-by-layer assembly), and then the sensitizer is removed using an organic solvent. This process is repeated so that various kinds of quantum dots are patterned on surfaces of various kinds of oxide films into desired shapes. Therefore, it is possible to form quantum dots with various light-emitting characteristics. Moreover, since the subject disclosure is applicable to a large-sized substrate, the subject disclosure may be utilized for transparent display devices, flexible display devices, large-sized display devices or the like.

DETAILED DESCRIPTION

Figure 1A:
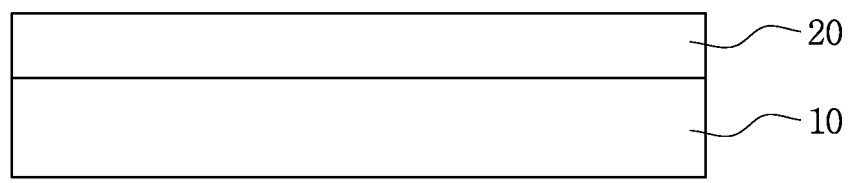
FIGS. 1A to 1L are cross-sectional views for illustrating a method of manufacturing a multicolor quantum dot pattern according to an embodiment of the present disclosure.

The following detailed description of the present disclosure refers to the accompanying drawings which show specific embodiments implemented by the present disclosure. These embodiments are described in detail so as to be easily implemented by those skilled in the art. It should be understood that various embodiments of the present disclosure are different from each other but not exclusive from each other. For example, specific shapes, structures and features written herein can be implemented in other embodiments without departing from the scope of the present disclosure. In addition, it should be understood that locations or arrangements of individual components in each embodiment may be changed without departing from the scope of the present disclosure. Therefore, the following detailed description is not directed to limiting the present disclosure, and the scope of the present disclosure is defined just with the appended claims along and their equivalents, if it is suitably explained. In the drawings, like reference numerals denote like elements through several drawings.

Hereinafter, embodiments of the present disclosure will be described in detail with reference to the accompanying drawings.

FIGS. 1A to 1L are cross-sectional views for illustrating a method of manufacturing a multicolor quantum dot pattern according to an embodiment of the present disclosure.

In the method of manufacturing a multicolor quantum dot pattern according to the present disclosure, aqueous (polar) quantum dots may be deposited to a substrate by using charges, and a plurality of quantum dot clusters may be formed on the same substrate by means of a quantum dot patterning technique using a sensitizer. In addition, by using the lift-off technique, it is possible to implement various kinds of quantum dots on a substrate simultaneously while preserving the quantum dots, which makes it possible to implement various quantum dot light-emitting spectrums.

In the present disclosure, since quantum dots frequently lose their characteristics over 100° C., all processes may be performed at 100° C. or below. Among the processes of the present disclosure, highest temperature is applied to quantum dots during a photoresist baking process in which a baking temperature may be set to 90° C. In addition, while various kinds of quantum dots are being coated successively, if patterned quantum dots are exposed to ultraviolet, plasma, ozone or chemicals, the quantum dots may lose their light-emitting characteristic or be damaged. Therefore, during a process of coating other quantum dots, patterned quantum dots may be protected with photoresist.

Referring to FIG. 1A, a first photoresist layer 20 is formed on a substrate 10.

The first photoresist layer 20 may be formed on the substrate 10 by means of a spin-coating method to have a predetermined thickness. For example, a photoresist material may be spin-coated to the substrate 10 at about 3000 rpm for about 30 seconds, and then soft-baked at about 90° C. for about 90 seconds.

The substrate 10 is surface-activated later by an oxygen plasma or ultraviolet-ozone generator, or by acid, base or microwave, and the substrate 10 may be formed with metal, base metal, ceramic, oxide film, semiconductor, organic matter, polymer or the like. The substrate 10 may have a flexible property or a transparent property. In addition, the present disclosure may be applied when the substrate 10 is a large-sized substrate.

For example, if the substrate 10 is formed as an oxide film substrate, the substrate 10 may include any one of $SiO_2$, $TiO_2$, indium tin oxide (ITO), $Y_2O_3$, $Al_2O_3$, ZnO, $WO_3$, $MoO_3$, NiO, ZTO and $SnO_2$. Meanwhile, if the substrate 10 is a polymer substrate, the substrate 10 may include any one of polymethylene (PE), polymethyl methacrylate (PMMA), polypropylene (PP), polyurethane (PUR), polystyrene (PS), polycarbonate (PC), perfluoro polyether (PFPE), polytetrafluoroethylene (PTFE) and acrylonitrile butadiene styrene (ABS).

The photoresist material used for forming the first photoresist layer 20 may have positive or negative polarity. However, the photoresist may be selected to be removed by an organic solvent having a polarity index of 0 to 7.5 after forming a pattern. However, when photoresist used in the photolithography process is removed after a patterning process, quantum dots should not be damaged by an organic solvent. Such an organic solvent may employ alcohol (ROH: the number of carbon in R is 1 to 3), acetone, DMSO, NMP, and a base solution (NaOH, KOH, $K_2CO_3$ or the like).

In the present disclosure, various kinds of quantum dots are patterned to a single substrate by using a photolithography process. The photolithography process may be performed regardless of the kind of the substrate as long as it is possible to coat a sensitizer.

Various photolithography processes have been developed, and a most general photolithography process allows a pattern of 1 micrometer level. It is also known that immersion lithography and extreme ultraviolet source are used, a pattern of several ten nanometer level may be formed in the present technology level.

Therefore, if quantum dots are patterned by means of the above approach, a multicolor quantum dot pattern may be implemented with a resolution of contact-printing or above.

Figure 1B:
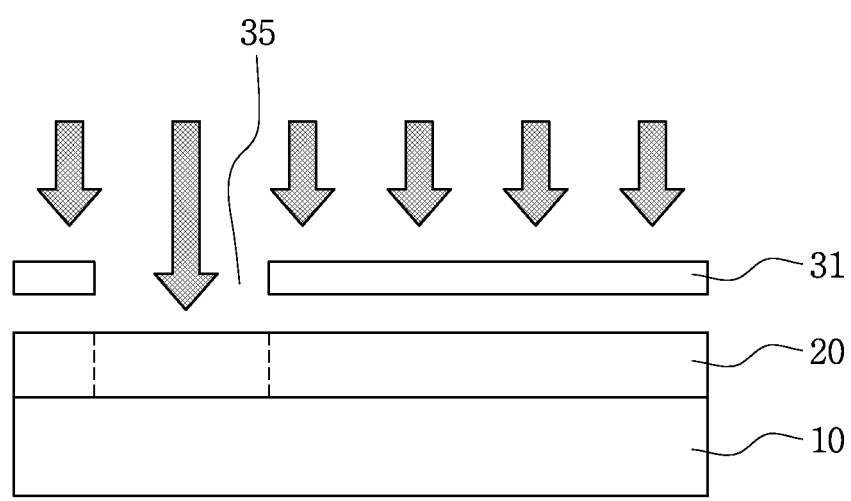

Referring to FIG. 1B, a first mask 31 is located on the substrate 10 having the first photoresist layer 20 formed thereon, and an exposing process is performed to form a first photoresist pattern.

The first mask 31 may have an opening 35 in a region corresponding to an area of the first photoresist layer 20 which is to be etched. The exposing process may use light, ion beam, electronic beam or the like. The opening 35 corresponds to an area where a quantum dot pattern is formed later. In an embodiment, if the quantum dot pattern is applied to a display element, the opening 35 may have a size corresponding to a pixel size.

After that, the substrate 10 may be developed to etch an area of the first photoresist layer 20 which corresponds to the opening 35.

For example, after the mask 31 having the opening 35 formed in a region where quantum dots are to be coated is located on the substrate 10, an exposing process may be performed for 12.5 seconds under a 350 W ultraviolet lamp. The exposed substrate 10 is developed for about 45 seconds in a developing solution, and just after the time, the substrate 10 may be dipped in D.I. water to stop developing.

Figure 1C:
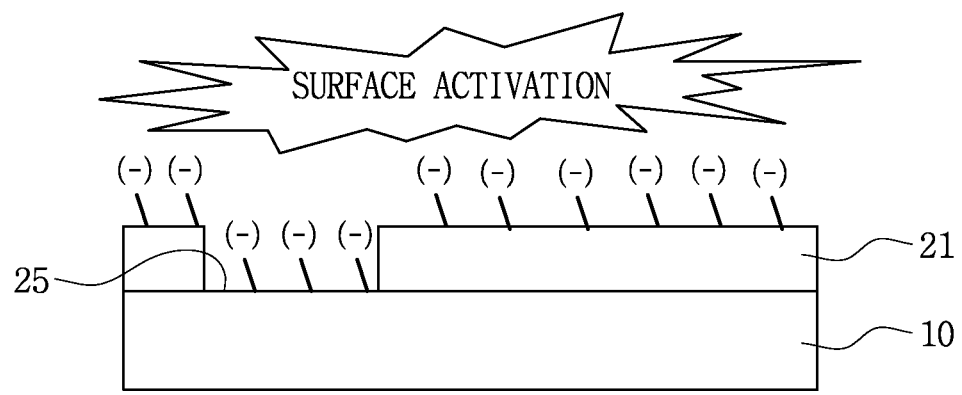

Then, the area of the first photoresist layer 20 corresponding to the opening 35 of the first mask 31 is etched to form a first photoresist pattern 21, which has a trench 25 exposing the substrate 10, on the substrate 10 (see FIG. 1C).

Referring to FIG. 1C, the surface of the substrate 10 on which the first photoresist pattern 21 is formed is activated.

In order to activate the substrate 10, a surface-activating method using any one of oxygen plasma, ultraviolet-ozone, acid, base and microwave may be used. For example, the surface-activating method using an acid may use any one of sulfuric acid, nitric acid and hydrochloric acid with pH 6 or below, and the surface-activating method using a base may use any one of NaOH, $K_2CO_3$, or KOH with pH 8 or above.

In an embodiment, a quartz substrate and a glass substrate washed for 10 minutes with ultrasonic waves in acetone and methanol, respectively, may be surface-activated in a reactive ion etching (RIE) for 60 seconds with an oxygen flow rate of 20 sccm, a total pressure of 20 mTorr, and plasma of 100 W.

Figure 1D:
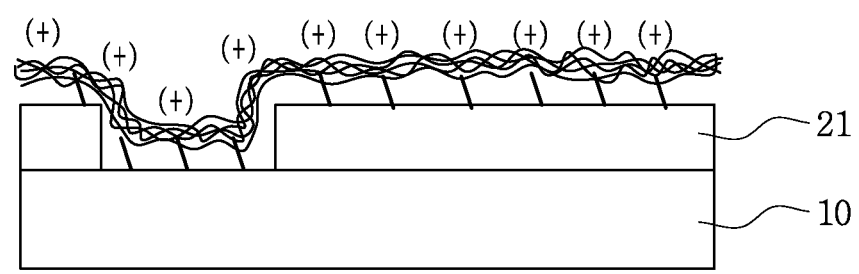
Figure 1E:
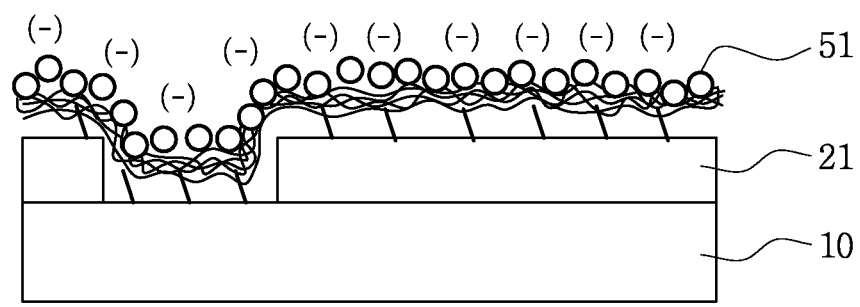

Referring to FIGS. 1D and 1E, a first quantum dot layer 51 is formed on the activated substrate 10.

The first quantum dot layer 51 may be formed by means of a layer-by-layer assembly method using charges. In detail, referring to FIG. 1D, a polymer charged with a polarity (for example, (+) charge) opposite to a surface charge (for example, (−) charge) of the activated substrate 10 is coated onto the substrate 10.

In the charged polymer, a 0.5 to 50 wt % of polymer electrolyte positively charged (+) or negatively charged (−) may be present in a solution state. For example, the charged polymer may be one of poly diallyldimethylamonium chloride (PDDA) and poly allylamine hydrochloride (PAH) in case the charged polymer is a positive charge polymer, and the charged polymer may be any one of poly sodium styrene sulfonate (PSS) and polyacrylic acid (PAA) in case the charged polymer is a negative charge polymer.

After that, the substrate 10 may be washed with water of pH 6 to pH 8 and dried with nitrogen. For example, the substrate 10 may be dipped in a poly diallyldimethylamonium chloride (PDDA) solution diluted with D.I. water, for about 20 minutes. After that, the substrate 10 may be taken out of the solution and washed with D.I. water, and then blow-dried by using a nitrogen ($N_2$) gun.

Subsequently, referring to FIG. 1E, quantum dots having a functional group charged with a polarity (for example, (−) charge) opposite to a polymer charge (for example, (+) charge) of the substrate 10 is coated. After that, the substrate 10 may be washed with water of pH 6 to pH 8 and dried with nitrogen.

The quantum dot is a semiconductor nano crystal in a state of 0.01 to 10 mg/ml solution, whose surface is modified to have a predetermined charge, and the material for charging may have a carboxyl group (—COOH) as a negative charge and an amine group (—$NH_3$) as a positive charge at its outermost portion of the modified surface. At this time, a light-emitting core portion of the semiconductor nano crystal may have a size of several nanometers to several ten nanometers.

In detail, the quantum dot represents a semiconductor nano crystal, in which its surface is modified using a compound to have charges (positive charges or negative charges), the solution is in a solution state (water soluble), and the solution has a concentration range of 0.1 to 0.0001 wt % (for example: 0.01 to 10 mg/ml).

The compound is composed with the quantum dot and an intermediate material, and the compound has a functional group such as R—COOH (acid), R1-N—R2-R3 (amine: primary or secondary or tertially) or R—OH (alcohol). At this time, R represents an alkyl group having 1 to 8 carbons. R1, R2 and R3 represent hydrogen (H) or materials having 1 to 8 carbons. The intermediate material may be excluded, and the intermediate material is selected from materials capable of combining the quantum dot and the compound, for example, PEG, amphiphilic compound, oleic compound, amine compound, phosphorus compound, organosulfur compound, silanol compound, dendrimer, protein, peptide or the like, without being limited thereto.

In this stage, the quantum dot solution diluted with D.I. water may be regularly coated to the surface by using a pipette, and then, after about 15 minutes, the quantum dot solution may be washed with D.I. water and blow-dried using a nitrogen ($N_2$) gun.

The processes of FIGS. 1D and 1E may be performed repeatedly until the first quantum dot layer 51 is formed to a desired thickness or so that the first quantum dot layer 51 is formed into multi layers.

Figure 1F:
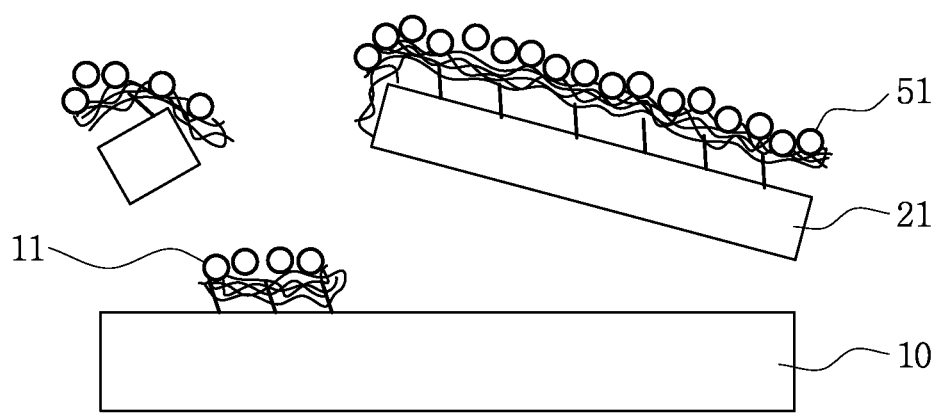

Referring to FIG. 1F, the first photoresist pattern 21 is removed from the substrate 10 on which the first quantum dot layer 51 is generated, thereby forming a first quantum dot pattern 11. At this time, when the first photoresist pattern 21 is removed, an organic solvent not damaging the quantum dots may be used to obtain an unbroken first quantum dot pattern 11 by selectively removing only the first photoresist pattern 21.

The first photoresist pattern 21 may be removed by means of a lift-off process. For example, the substrate 10 may be put into acetone and dipped in an ultrasonic vibration bath for 15 minutes to remove the photoresist, and the photoresist-free substrate 10 may be dipped methanol and dipped in the ultrasonic vibration bath again for 5 minutes to remove residual acetone.

As described above, if the first photoresist pattern 21 is removed from the substrate 10, only the first quantum dot pattern 11 remains. After that, a second quantum dot pattern 12 may be formed at another location on the substrate 10 on which the first quantum dot pattern 11 is generated. For example, the first photoresist pattern 21 may be formed to have a size corresponding to a pixel size of a display element.

The second quantum dot pattern 12 may have a light-emitting characteristic identical to or different from that of the first quantum dot pattern 11. However, since quantum dot patterns having the same light-emitting characteristic may be formed by a single photolithography process using a mask, it would be more advantageous that a second quantum dot pattern 12 having a light-emitting characteristic different from the first quantum dot pattern 11 is formed.

In order to form the second quantum dot pattern 12, the same process as forming the first quantum dot pattern 11 is performed. In other words, a process of depositing aqueous (polar) quantum dots to a substrate by using charges and using a quantum dot patterning technique using a sensitizer is performed repeatedly. Hereinafter, the process of forming the second quantum dot pattern 12 will be described in detail.

Figure 1G:
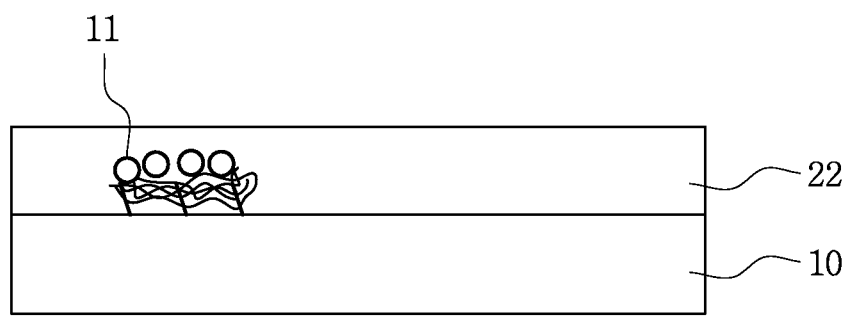

Referring to FIG. 1G, the second photoresist layer 22 is formed on the substrate 10 on which the first quantum dot pattern 11 is generated. The second photoresist layer 22 covers the first quantum dot pattern 11, which may protect the first quantum dot pattern 11 in a photolithography process later.

Similarly, the second photoresist layer 22 may be formed on the substrate 10 by means of a spin-coating method to have a predetermined thickness. In addition, photoresist material used for forming the first photoresist layer 20 may have positive or negative polarity. However, the photoresist may be selected to be removed by an organic solvent having a polarity index of 0 to 7.5 after forming a pattern.

Figure 1H:
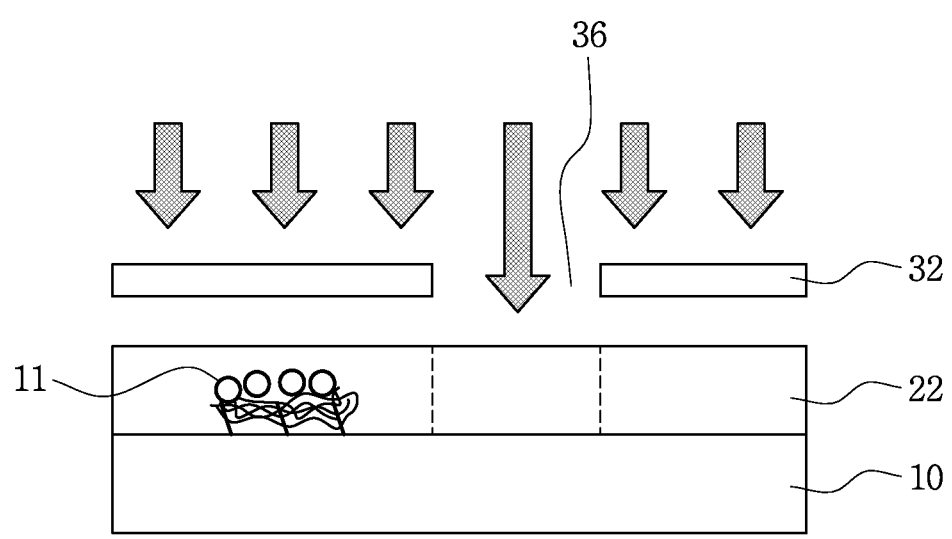

Referring to FIG. 1H, a second mask 32 is located on the substrate 10 on which the second photoresist layer 22 is formed, and an exposing process is performed to form a second photoresist pattern.

The second mask 32 may have an opening 36 in a region corresponding to an area of the second photoresist layer 22 which is to be etched. The exposing process may use light, ion beam, electronic beam or the like.

After that, the substrate 10 may be developed to etch an area of the second photoresist layer 22 which corresponds to the opening 36.

Figure 1I:
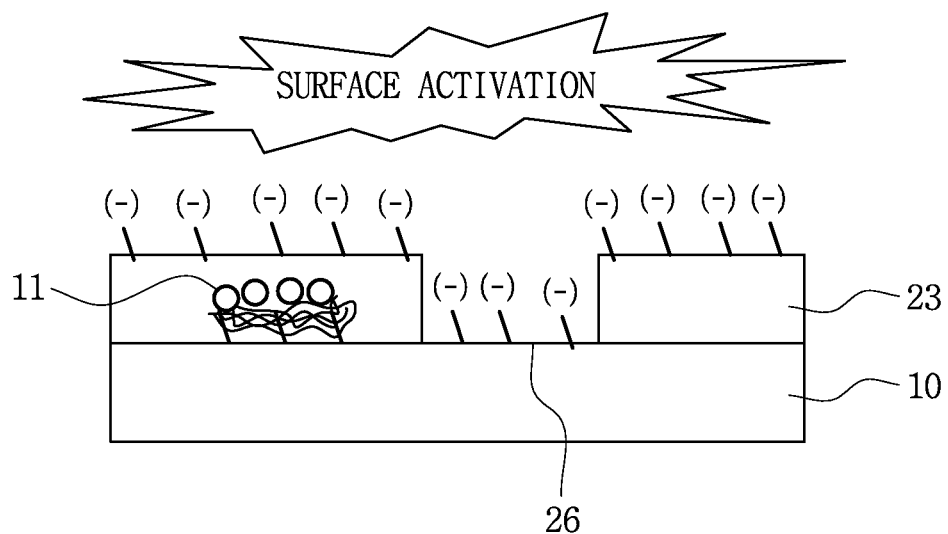

The area of the second photoresist layer 22 corresponding to the opening 36 of the second mask 32 is etched to form a second photoresist pattern 23, which has a trench 26 exposing the substrate 10, on the substrate 10 (see FIG. 1I).

Referring to FIG. 1I, the surface of the substrate 10 on which the second photoresist pattern 23 is formed is activated.

In order to activate the substrate 10, a surface-activating method using any one of oxygen plasma, ultraviolet-ozone, acid, base and microwave may be used. For example, the surface-activating method using an acid may use any one of sulfuric acid, nitric acid and hydrochloric acid with pH 6 or below, and the surface-activating method using a base may use any one of NaOH, $K_2CO_3$, or KOH with pH 8 or above.

Figure 1J:
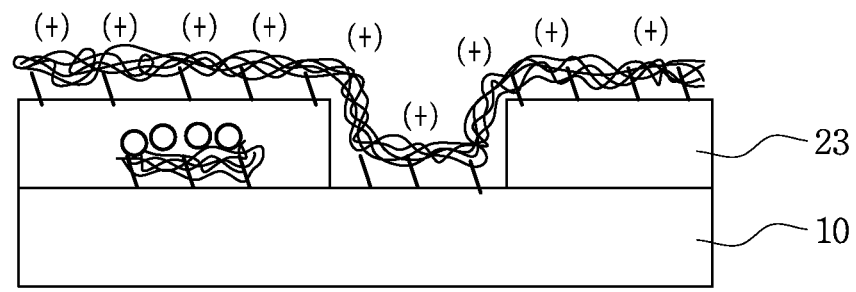
Figure 1K:
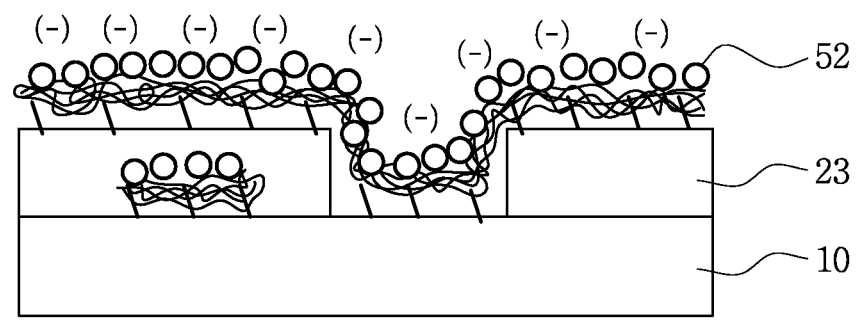

Referring to FIGS. 1J and 1K, a second quantum dot layer 52 is formed on the activated substrate 10.

The second quantum dot layer 52 may be formed by means of a layer-by-layer assembly method using charges. In detail, referring to FIG. 1J, a polymer charged with a polarity (for example, (+) charge) opposite to a surface charge (for example, (−) charge) of the activated substrate 10 is coated onto the substrate 10. After that, the substrate 10 may be washed with water of pH 6 to pH 8 and dried with nitrogen.

Subsequently, referring to FIG. 1K, quantum dots having a functional group charged with a polarity (for example, (−) charge) opposite to a polymer charge of the substrate 10 is coated. After that, the substrate 10 may be washed with water of pH 6 to pH 8 and dried with nitrogen.

The processes of FIGS. 1J and 1K may be performed repeatedly until the second quantum dot layer 52 is formed to a desired thickness or so that the second quantum dot layer 52 is formed into multi layers.

Figure 1L:
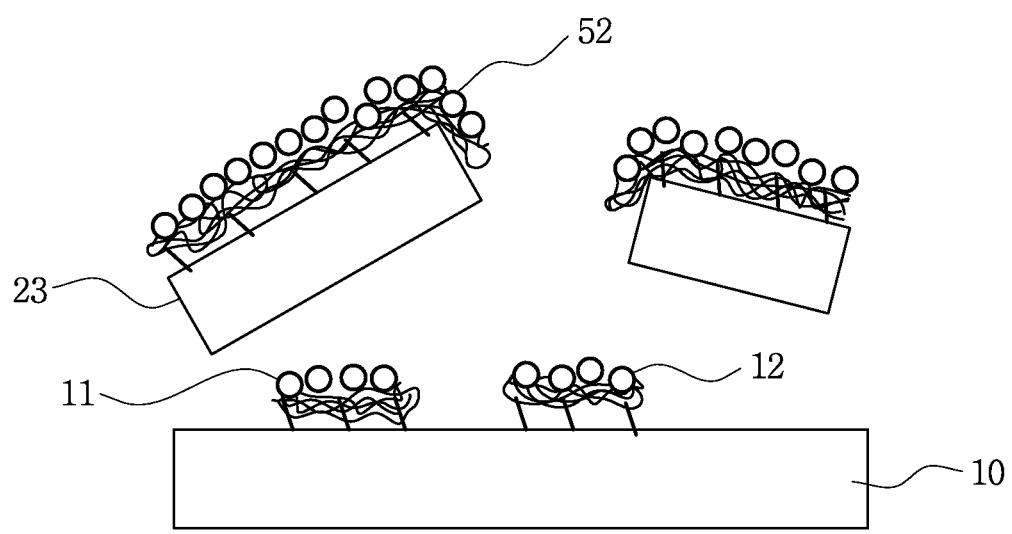

Referring to FIG. 1L, the second photoresist pattern 23 is removed from the substrate 10 on which the second quantum dot layer 52 is generated, thereby forming a second quantum dot pattern 12. At this time, when the second photoresist pattern 23 is removed, an organic solvent not damaging the quantum dots may be used to obtain an unbroken second quantum dot pattern 12 below and the first quantum dot pattern 11 by selectively removing only the second photoresist pattern 23.

The second photoresist pattern 23 may be removed by means of a lift-off process. For example, the substrate 10 may be dipped in an organic solvent to remove the second photoresist pattern 23.

By doing so, the first quantum dot pattern 11 and the second quantum dot pattern 12 formed on the same layer of the single substrate 10 are exposed. In addition, the above process may be repeated to form various quantum dot patterns as desired.

The present disclosure may implement various quantum dot light-emitting spectrums by applying various kinds of quantum dots onto the substrate 10 while preserving the first quantum dot pattern 11 generated by means of the lift-off technique. In addition, by using a photolithography process using a photoresist, the present disclosure may be applied to a large-sized substrate.

In the present disclosure, a coated region and an exposed region of the substrate are classified by using the photoresist material, and then the surface of the substrate is activated and a quantum dot layer is formed on the surface of the substrate by using charges. After that, the photoresist is removed by using an organic solvent so that quantum dots remain only on the substrate, and then the surface of the substrate is patterned again by using a positive photoresist so that a region where quantum dots are to be formed is exposed. After that, a quantum dot layer is formed again, and the photoresist is removed using an organic solvent. This process is repeated so that quantum dots may be patterned to the substrate in various ways just by an exposing technique which is already established in an existing semiconductor process.

Figure 2:
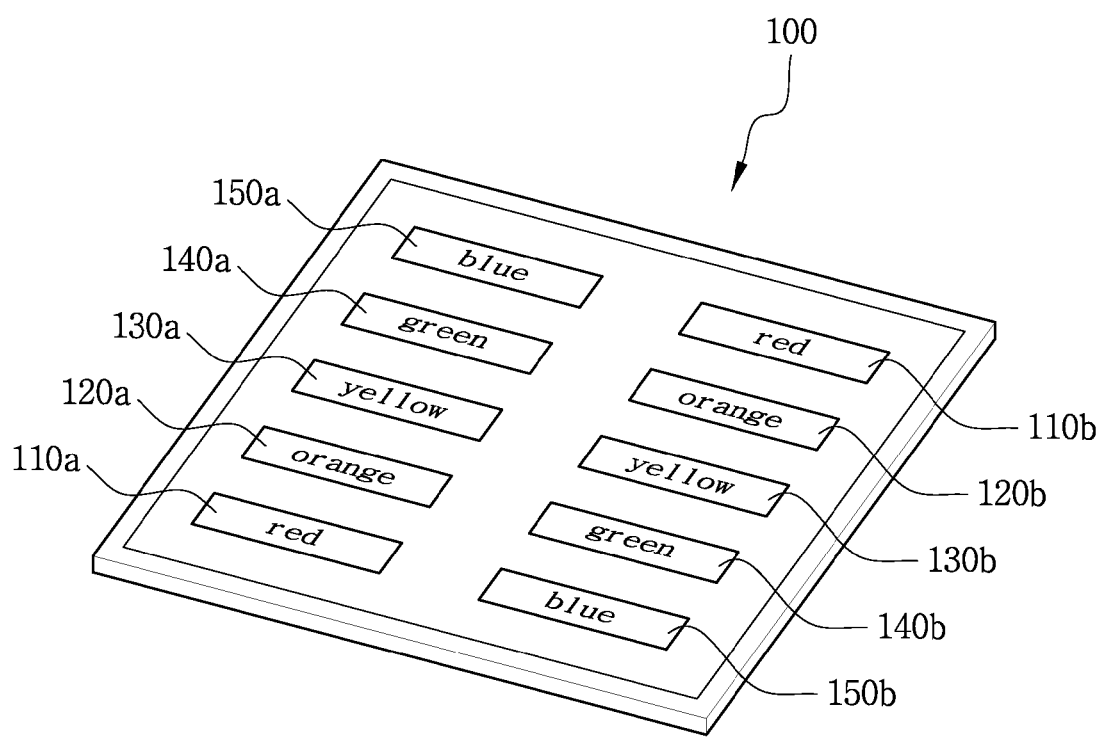
FIG. 2 shows an example of a multicolor quantum dot pattern formed according to an embodiment of the present disclosure.

FIG. 2 shows an example of a multicolor quantum dot pattern 100 formed according to an embodiment of the present disclosure.

In the present disclosure, quantum dots emitting various colors are directly patterned to a target substrate by means of a photolithography process. By doing so, quantum dots of desired kinds, desired numbers and desired shapes may be formed on the same layer of a single substrate. In addition, the manufacturing process of the present disclosure may be easily performed by adapting a patterning technique using a sensitizer, which is used in a semiconductor process, to the method of forming a quantum dot pattern by using charges.

Referring to FIG. 2, quantum dot patterns emitting various colors are formed on the substrate 10. The quantum dot patterns may emit at least two different colors. The quantum dot patterns may implement a resolution to a level allowed by the photolithography process. In an embodiment, each quantum dot pattern may have a size corresponding to a pixel size of the display element.

In addition, at least one of the quantum dot patterns may be formed as a multi-layer.

Each quantum dot of the quantum dot pattern has a polar functional group. For example, the quantum dot has a functional group at its outermost portion so that its surface has a predetermined charge, and the functional group may have a carboxyl group (—COOH) as a negative charge and an amine group (—$NH_3$) as a positive charge.

In FIG. 2, a line patter is formed using five kinds of quantum dots. In other words, patterns 110a, 110b have a light emission frequency of 620 nm which is a red color, patterns 120a, 120b have a light emission frequency of 580 nm which is an orange color, patterns 130a, 130b have a light emission frequency of 560 nm which is a yellow color, patterns 140a, 140b have a light emission frequency of 530 nm which is a green color, and patterns 150a, 150b have a light emission frequency of 490 nm which is a blue color.

The substrate 10 may be formed with metal, base metal, ceramic, oxide film, semiconductor, organic matter, polymer or the like, whose surface is activated by an oxygen plasma or ultraviolet-ozone generator, or by acid, base or microwave. The substrate 10 may have a flexible property or a transparent property.

For example, if the substrate 10 is formed as an oxide film substrate, the substrate 10 may include any one of $SiO_2$, $TiO_2$, indium tin oxide (ITO), $Y_2O_3$, $Al_2O_3$, ZnO, $WO_3$, $MoO_3$, NiO, ZTO and $SnO_2$. Meanwhile, if the substrate 10 is a polymer substrate, the substrate 10 may include any one of polymethylene (PE), polymethyl methacrylate (PMMA), polypropylene (PP), polyurethane (PUR), polystyrene (PS), polycarbonate (PC), perfluoro polyether (PFPE), polytetrafluoroethylene (PTFE) and acrylonitrile butadiene styrene (ABS).

However, the substrate 10 is not limited to the above but may employ any substrate whose surface is activated by oxygen plasma or the like.

Figure 3:
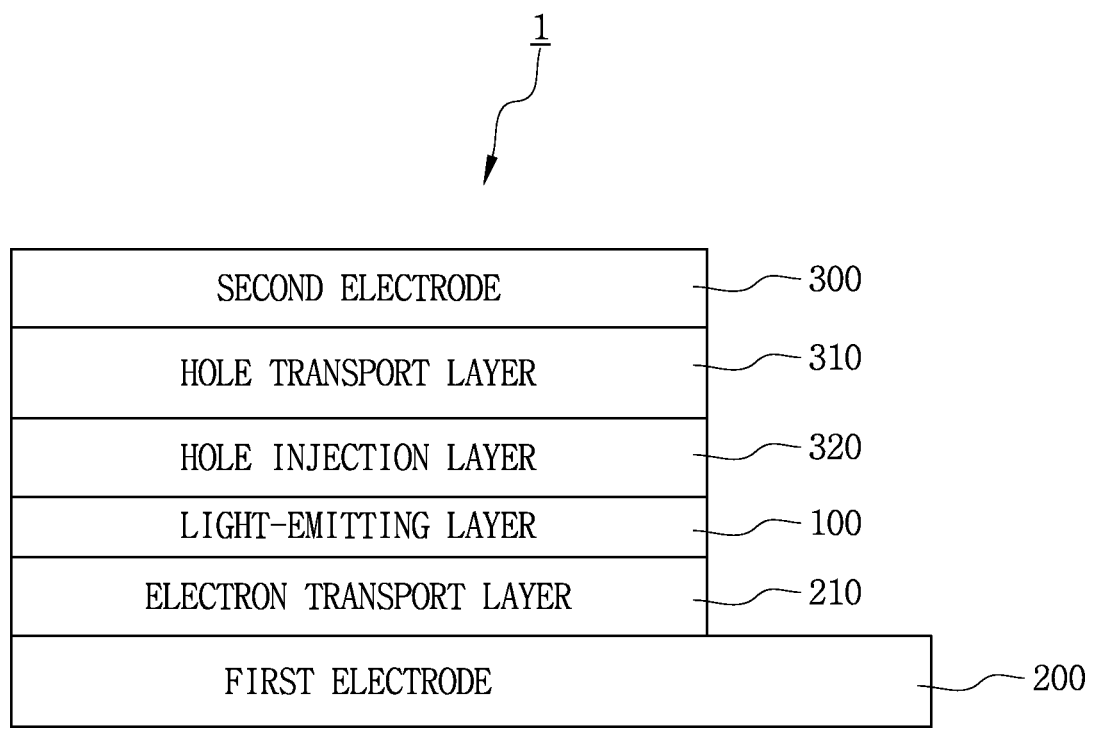
FIG. 3 shows an example of a quantum dot light-emitting device in which a multicolor quantum dot pattern formed according to an embodiment of the present disclosure is applied to a light-emitting layer.

FIG. 3 shows an example of a quantum dot light-emitting device in which a multicolor quantum dot pattern formed according to an embodiment of the present disclosure is applied to a light-emitting layer.

Referring to FIG. 3, a quantum dot light-emitting device 1 includes at least one of an electron injection layer (not shown), an electron transport layer 210, a hole transport layer 310 and a hole injection layer 320 between a first electrode 200 and a second electrode 300 and also includes a multicolor quantum dot pattern as a light-emitting layer 100.

In an embodiment, the multicolor quantum dot pattern serving as the light-emitting layer 100 may be formed by forming at least one of the electron injection layer (not shown) and the electron transport layer 210 on the transparent electrode substrate 200 and then applying the method of manufacturing a multicolor quantum dot pattern according to the present disclosure.

Accordingly, the present disclosure may be applied to large-sized display devices, transparent display devices and flexible display devices in various ways.

While the exemplary embodiments have been shown and described, it will be understood by those skilled in the art that various changes in form and details may be made thereto without departing from the spirit and scope of this disclosure as defined by the appended claims.

Since quantum dots emitting various colors are directly formed on a target substrate by using an exposing process, quantum dot patterns may be easily formed at low costs. The method according to the present disclosure may be applied to various kinds of substrates, and the method may also be applied to transparent displays or the like since the coated quantum dots allow light transmission due to their small thickness. Further, since quantum dots may also be patterned to a polymer, the present disclosure may be utilized for flexible displays and applied to large-size substrates.

In addition, since the method of manufacturing a multicolor quantum dot pattern according to the present disclosure uses an exposing technique which is already established in an existing semiconductor process, the present disclosure has compatibility with the existing process, and thus it is possible to reduce costs required for constructing process equipment.

The multicolor quantum dot patterns formed according to the present disclosure may be utilized for expanding or amplifying a sensing zone or an energy conversion zone by using a quantum dot wavelength conversion characteristic, in case of a sensor or a solar cell. In addition, in case display pixels are composed of quantum dots, an existing transferring process to a substrate by using polymer stamps may be substituted with the photolithography process.

In addition, even though an existing quantum dot display is being utilized just as a back light unit, quantum dots in the multicolor quantum dot pattern formed according to the present disclosure may electrically emit light by themselves, and thus it is expected that an organic light-emitting material is substituted with quantum dots, which may form a market similar to the OLED market.

What is claimed is:

1. A method of manufacturing a multicolor quantum dot pattern, comprising:
    forming a first photoresist pattern on a substrate;
    activating a surface of the substrate having the first photoresist pattern formed thereon using a surface activating method selected from the group consisting of oxygen plasma, ultraviolet-ozone, acid, base and microwave;
    forming a first quantum dot layer on the activated substrate;
    generating a first quantum dot pattern by removing the first photoresist pattern; and
    generating a second quantum dot pattern on the same layer as the first quantum dot pattern generated on the substrate.

2. The method of manufacturing a multicolor quantum dot pattern according to claim 1, wherein the generating of a second quantum dot pattern includes:
    forming a second photoresist pattern on the substrate to cover the first quantum dot pattern;
    activating the surface of the substrate on which the second photoresist pattern is formed using a surface activating method selected from the group consisting of oxygen plasma, ultraviolet-ozone, acid, base and microwave;
    forming a second quantum dot layer on the activated substrate; and
    generating a second quantum dot pattern by removing the second photoresist pattern.

3. The method of manufacturing a multicolor quantum dot pattern according to claim 1,
    wherein the forming of a first quantum dot layer on the activated substrate forms a first quantum dot layer by means of a layer-by-layer assembly method using charges.

4. The method of manufacturing a multicolor quantum dot pattern according to claim 3, wherein the forming of a first quantum dot layer on the activated substrate includes:
    coating a polymer charged with a polarity opposite to a surface charge of the activated substrate onto the substrate;
    washing the substrate with water having pH 6 to pH 8;
    drying the substrate with nitrogen;
    coating quantum dots having a functional group charged with a polarity opposite to the polymer charge of the substrate onto the substrate;
    washing the substrate with water having pH 6 to pH 8; and
    drying the substrate with nitrogen.

5. The method of manufacturing a multicolor quantum dot pattern according to claim 4,
    wherein the forming of a first quantum dot layer on the activated substrate forms the first quantum dot layer into a multi-layer by repeatedly executing the steps defined in the claim 4.

6. The method of manufacturing a multicolor quantum dot pattern according to claim 4,
    wherein the charged polymer is present in a solution state containing 0.5 to 50 wt % of positively-charged or negatively-charged polymer electrolyte.

7. The method of manufacturing a multicolor quantum dot pattern according to claim 6,
wherein the charged polymer is any one of poly diallyldimethylamonium chloride (PDDA) and poly allylamine hydrochloride (PAH) in case the charged polymer is a positive charge polymer, and the charged polymer is any one of poly sodium styrene sulfonate (PSS) and polyacrylic acid (PAA) in case the charged polymer is a negative charge polymer.

8. The method of manufacturing a multicolor quantum dot pattern according to claim 4,
wherein the quantum dot is a semiconductor nano crystal in a state of 0.01 to 10 mg/ml solution, whose surface is modified to have a predetermined charge.

9. The method of manufacturing a multicolor quantum dot pattern according to claim 8,
wherein the semiconductor nano crystal has a light-emitting core portion with a size of several nanometers to several ten nanometers.

10. The method of manufacturing a multicolor quantum dot pattern according to claim 8,
wherein the quantum dot is surface-modified with a compound to have a charge, and the compound is composed with the quantum dot or intermediate material.

11. The method of manufacturing a multicolor quantum dot pattern according to claim 10,
wherein the compound has at least one functional group selected from the group consisting of R—COOH (acid), R1-N—R2-R3 (amine: primary or secondary or tertially) and R—OH (alcohol) (where R represents an alkyl group having 1 to 8 carbons, and R1, R2 and R3 represent hydrogen (H) or materials having 1 to 8 carbons).

12. The method of manufacturing a multicolor quantum dot pattern according to claim 10,
wherein the intermediate material is at least one selected from the group consisting of PEG, amphiphilic compound, oleic compound, amine compound, phosphorus compound, organosulfur compound, silane compound, dendrimer, protein and peptide.

13. The method of manufacturing a multicolor quantum dot pattern according to claim 1,
wherein the surface-activating method using an acid uses any one selected from the group of sulfuric acid, nitric acid and hydrochloric acid with pH 6 or below.

14. The method of manufacturing a multicolor quantum dot pattern according to claim 1,
wherein the surface-activating method using a base uses any one selected from the group of NaOH, $K_2CO_3$, or KOH with pH 8 or above.

15. The method of manufacturing a multicolor quantum dot pattern according to claim 1,
wherein the substrate is formed with any one selected from the group consisting of metal, base metal, ceramic, oxide film, semiconductor, organic matter and polymer.

16. The method of manufacturing a multicolor quantum dot pattern according to claim 15,
wherein the oxide film includes at least one of $SiO_2$, $TiO_2$, indium tin oxide (ITO), $Y_2O_3$, $A_{12}O_3$, ZnO, $WO_3$, $MoO_3$, NiO, ZTO and $SnO_2$, and
wherein the polymer includes at least one of polymethylene (PE), polymethyl methacrylate (PMMA), polypropylene (PP), polyurethane (PUR), polystyrene (PS), polycarbonate (PC), perfluoro polyether (PFPE), polytetrafluoroethylene (PTFE) and acrylonitrile butadiene styrene (ABS).

17. The method of manufacturing a multicolor quantum dot pattern according to claim 1,
wherein the second quantum dot has a light-emitting characteristic different from the first quantum dot.

18. The method of manufacturing a multicolor quantum dot pattern according to claim 1,
wherein the second quantum dot has the same light-emitting characteristic as the first quantum dot.

19. The method of manufacturing a multicolor quantum dot pattern according to claim 1,
wherein the first photoresist pattern is formed with a photoresist which is removed by an organic solvent having a polarity index of 0 to 7.5.

20. The method of manufacturing a multicolor quantum dot pattern according to claim 19,
wherein the organic solvent includes at least one of alcohol (ROH: the number of carbon in R is 1 to 3), acetone, DMSO, NMP, NaOH, KOH and $K_2CO_3$.

21. The method of manufacturing a multicolor quantum dot pattern according to claim 1, wherein the forming of a first quantum dot layer on the activated substrate includes: forming a first photoresist layer on the substrate; and etching the first photoresist layer to form a first photoresist pattern.

22. The method of manufacturing a multicolor quantum dot pattern according to claim 21, wherein the etching of the first photoresist layer to form a first photoresist pattern uses any one of light, ion beam and electronic beam.

* * * * *